United States Patent
Ueda

(10) Patent No.: US 9,177,912 B2
(45) Date of Patent: Nov. 3, 2015

(54) SEMICONDUCTOR DEVICE HAVING A FUSE ELEMENT

(71) Applicant: Renesas Electronics Corporation, Tokyo (JP)

(72) Inventor: Takehiro Ueda, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 109 days.

(21) Appl. No.: 14/086,268

(22) Filed: Nov. 21, 2013

(65) Prior Publication Data
US 2014/0077335 A1    Mar. 20, 2014

Related U.S. Application Data

(62) Division of application No. 13/721,962, filed on Dec. 20, 2012, now Pat. No. 8,610,178, which is a division of application No. 13/180,050, filed on Jul. 11, 2011, now Pat. No. 8,362,524, which is a division of application No. 11/798,982, filed on May 18, 2007, now Pat. No. 7,994,544, which is a division of application No. 10/900,205, filed on Jul. 28, 2004, now Pat. No. 7,282,751.

(30) Foreign Application Priority Data

Aug. 7, 2003   (JP) .................................. 2003-288829

(51) Int. Cl.
*H01L 27/10*   (2006.01)
*H01L 23/525*  (2006.01)
*H01L 23/34*   (2006.01)

(52) U.S. Cl.
CPC ............ *H01L 23/525* (2013.01); *H01L 23/345* (2013.01); *H01L 23/5256* (2013.01); *H01L 2924/0002* (2013.01)

(58) Field of Classification Search
CPC ...................................................... H01L 23/345
USPC .................... 257/209, 529, 665, 758, E29.319
See application file for complete search history.

(56) References Cited

U.S. PATENT DOCUMENTS 4,064,493 A   12/1977  Davis
5,420,456 A    5/1995  Gaibi et al.

(Continued)

FOREIGN PATENT DOCUMENTS

JP   57-075442   5/1982
JP   361147548   7/1986

(Continued)

OTHER PUBLICATIONS

Japanese Patent Office issued a Japanese office Action dated Sep. 1, 2009, Application No. 2003-288829.

*Primary Examiner* — Samuel Gebremariam
(74) *Attorney, Agent, or Firm* — Young & Thompson

(57) ABSTRACT

A portion-to-be-melted of a fuse is surrounded by plates, so that heat to be generated in a meltdown portion of the fuse under current supply can be confined or accumulated in the vicinity of the meltdown portion of the fuse. This makes it possible to facilitate meltdown of the fuse. The meltdown portion of the fuse in a folded form, rather than in a single here a fuse composed of a straight-line form, is more successful in readily concentrating the heat generated in the fuse under current supply into the meltdown portion, and in further facilitating the meltdown of the fuse.

12 Claims, 5 Drawing Sheets

(56) References Cited

U.S. PATENT DOCUMENTS

| | | |
|---|---|---|
| 5,585,663 A | 12/1996 | Bezama et al. |
| 5,903,041 A | 5/1999 | La Fleur et al. |
| 5,990,537 A | 11/1999 | Endo et al. |
| 6,162,686 A | 12/2000 | Huang et al. |
| 6,713,837 B1 | 3/2004 | Mori et al. |
| 6,872,648 B2 | 3/2005 | Friese et al. |
| 6,876,057 B2 | 4/2005 | Watanabe |
| 7,282,751 B2 | 10/2007 | Ueda |
| 8,362,524 B2 | 1/2013 | Ueda |

FOREIGN PATENT DOCUMENTS

| | | |
|---|---|---|
| JP | 06-151745 | 5/1994 |
| JP | 10-084108 | 3/1998 |
| JP | 2000-40790 | 2/2000 |
| JP | 2003-209174 | 7/2003 |

SEMICONDUCTOR DEVICE HAVING A FUSE ELEMENT

This application is based on Japanese patent application No. 2003-288829, the content of which is incorporated hereinto by reference.

BACKGROUND OF THE INVENTION

1. Field of the Invention

The present invention relates to a semiconductor device, and in particular to a semiconductor device mounted with a fuse.

2. Description of the Related Art

Mounting of a fuse on a semiconductor device makes it possible to adjust value of resistors used in the semiconductor device or replace a defective element with a normal element, by once disconnecting the fuse. This technique of replacing a defective element with a normal element is typically applied to redundancy design of the semiconductor memory device. Disconnection of the fuse is often achieved by blowing it off with a laser. The method of blowing the fuse off using the laser, however, raises several problems.

A first problem resides in that a position of disconnection of the fuse must be apart from other elements by a predetermined distance so as to avoid any possible influences of the laser-assisted disconnection of the fuse, and this increases the device size in view of securing a sufficient space therefor.

The next problem is that one or two dedicated lithographic process steps are further required to form the fuse in addition to the general process steps, and this consequently results in larger cost and longer process time. More specifically, the fuse will generally have an interlayer film formed thereon, so that it is necessary, in the final process step, to form an opening for the convenience of laser irradiation in the interlayer film so as to adjust the thickness of the interlayer film on the fuse. In evaluation of any products incorporated with the fuse, it is essential to carry out a series of process steps of "characteristic inspection", "disconnection of fuse by laser irradiation" and "characteristic re-inspection". This undesirably results in further elongation of the process steps and increase in the cost.

To solve the above-described problems in the laser-assisted disconnection of the fuse, a proposal is made on current-assisted meltdown of the fuse in place of using the laser. As one typical method of facilitating the current-assisted disconnection of the fuse Japanese Laid-Open Patent Publication No. 2000-40790 discloses a procedure of narrowing as possible a meltdown portion of the fuse by oblique ion implantation through a mask formed on the meltdown portion of the fuse.

The fuse disclosed in Japanese Laid-Open Patent Publication No. 2000-40790 can certainly reduce current and/or voltage necessary for meltdown the fuse, but further reduction in the current and/or voltage for meltdown will be necessary if the semiconductor devices mounted with the fuse are desired to be applied to circuits driven under low voltage, in consideration of influences on other elements.

SUMMARY OF THE INVENTION

It is therefore an object of the present invention to provide a semiconductor device mounted with a fuse adapted to a smaller current and/or voltage for the meltdown, characterized in having a fuse possibly melted by further smaller current and/or voltage.

According to the present invention, there is provided a semiconductor device disposed on a substrate, and has a conductor possibly be disconnected upon being supplied with current, wherein the semiconductor device has at least one parallel plate composed of a flat surface in parallel to the direction of current flow in the vicinity of the conductor.

The semiconductor device of the present invention may further comprise at least one vertical plate composed of a flat surface normal to the direction of current flow in the vicinity of the conductor, and the vertical plate may have an opening which allows a current entrance portion or a current exit portion to pass therethrough.

In the semiconductor device of the present invention, at least one parallel plate may comprise a pair of flat surfaces opposed to each other in parallel to the direction of current flow to thereby configure first and second parallel plates placing the conductor in between; or may comprise a pair of flat surfaces opposed to each other in parallel to the direction of current flow to thereby configure first and second parallel plates placing the conductor in between, and a pair of flat surfaces opposed to each other and normal to the first and second parallel plates to thereby configure third and fourth parallel plates placing the conductor in between.

In the above-described semiconductor device of the present invention, at least one parallel plate may be disposed between a semiconductor element or wiring, which is arranged on a flat surface in parallel to said direction of current flow, and the conductor.

In the above-described semiconductor device of the present invention, the conductor may have a straight-line form, or may have a form such as extending unidirectionally and being folded at least once. In particular in the latter case, the conductor may have a forward straight portion extending in a single direction, and a backward straight portion extending back in a direction opposite to the single direction, and the conductor may further comprise a normal straight portion normal to the single direction, which connects the forward straight portion and the backward straight portion.

In the above-described semiconductor device of the present invention, the substrate may be configured as having a transistor formed thereon, wherein the conductor is supplied with the current by turning the transistor on, and the transistor may be a MOSFET.

In the above-described semiconductor device of the present invention, the conductor may be any of a material mainly composed of copper (Cu), doped polysilicon, silicon-germanium alloy and silicide.

As has been explained in the above, in the semiconductor device mounted with the fuse of the present invention, a portion-to-be-melted of the fuse is surrounded by the plates, so that heat to be generated in the meltdown portion of the fuse under current supply can be confined or accumulated in the vicinity of the meltdown portion of the fuse. This makes it possible to facilitate meltdown of the fuse. The meltdown portion of the fuse in a folded form, rather than in a single straight-line form, also makes it possible to more readily concentrate the heat generated in the fuse under current supply into the meltdown portion, and to further facilitate the meltdown of the fuse.

DETAILED DESCRIPTION OF THE INVENTION

The following paragraphs will specifically describe the semiconductor device mounted with the fuse composed of the conductor according to the present invention referring to preferred embodiments, wherein they are to be understood as being merely for the purpose of description and not of limitation.

Embodiment 1

Figure 1A:
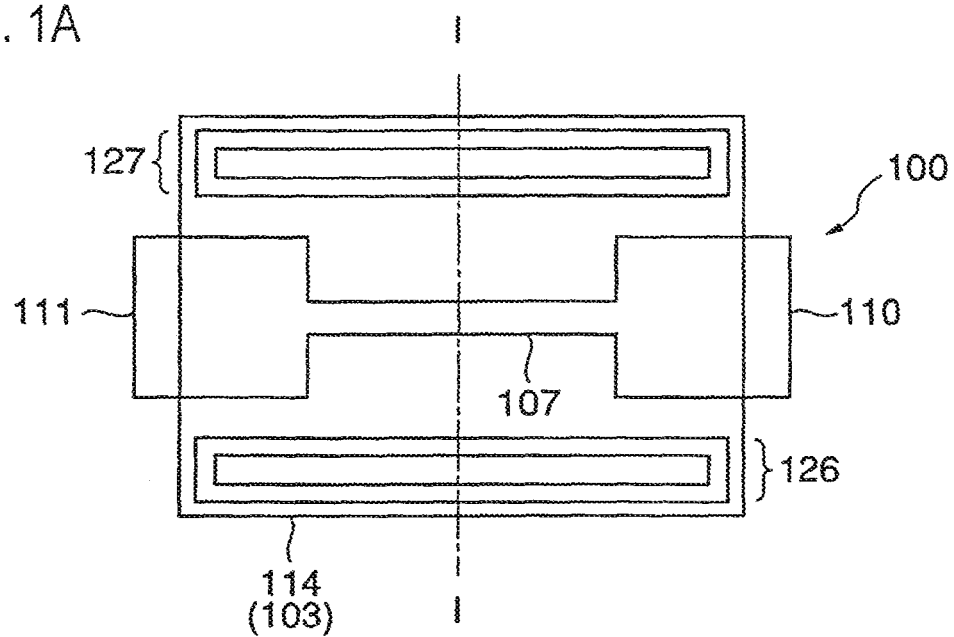
FIG. 1A is a plan view showing a form of a fuse according to a first embodiment of the present invention.

A first embodiment of the present invention will be explained referring to FIG. 1A and FIG. 1B. The first embodiment shows a case where a fuse, which is a straight-line-formed conductor, is disposed in parallel to the surface of a semiconductor substrate. FIG. 1A is a plan view of the fuse, and FIG. 1B is a sectional view taken along line I-I in FIG. 1A.

Figure 1B:
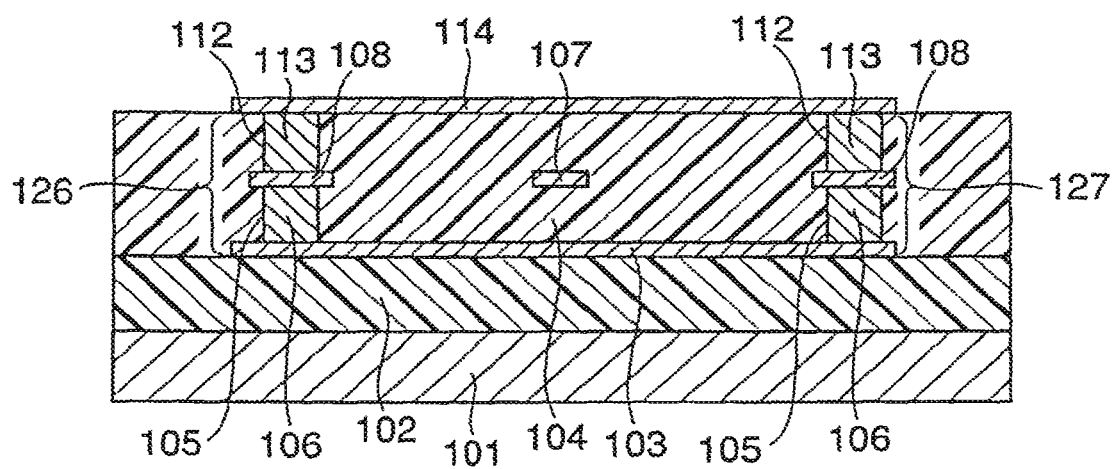
FIG. 1B is a sectional view taken along line I-I in FIG. 1A.

As shown in FIGS. 1A and 1B, a fuse 100 is provided in a second interlayer dielectric film 104 on a first interlayer dielectric film 102 on a semiconductor substrate 101. It is to be noted that the second interlayer dielectric film 104 is practically composed of a plurality of interlayer dielectric films although it is illustrated herein as a single layer for the simplicity of explanation. The fuse 100 is covered with a lower plate 103 and an upper plate 114, which compose a pair of parallel plates, respectively on the lower and upper portions of a fuse meltdown portion 107, and with via plugs 106, 113 filled in via holes 105, 112 on the side portions of the fuse meltdown portion 107. The upper and lower via plugs 113, 106 are interconnected through pad electrodes 108 formed at the same time with the fuse 100, and the via plugs 106, 113 thus configure, together with the pad electrodes 108, side plates 126 and 127 both of which correspond to a pair of vertical plates, on each of lateral sides, respectively, of the fuse 100.

The fuse 100 is melted down by supplying a predetermined energy of current from a current entrance terminal 110 towards a current exit terminal 111 (the directionality may be inverted), which are formed at the same time with the fuse meltdown portion 107. With the aid of ON/OFF operation of an unillustrated transistor, which is typically a MOSFET, connected to the current entrance terminal 110, the ON operation can supply the current for meltdown, and OFF operation can stop supply of the current for meltdown.

When a predetermined energy of current is supplied from the current entrance terminal 110 towards the current exit terminal 111, heat is generated at the fuse meltdown portion 107 of the fuse 100 and is concentrated thereto after being intercepted and reflected by the plates 114, 103, 126, 127 on the vertical and lateral sides, so as to cause easy meltdown. At the same time, the conductor to be scattered around can be blocked by the lower plate 103, upper plate 114 and side plates 126, 127, and is prevented from reaching the other elements arranged outside these plates.

Although this embodiment adopted a structure in which the meltdown portion of the fuse is almost completely enveloped by disposing the conductor plates on the vertical and lateral sides of the fuse, the present invention is by no means limited thereto. More specifically, in an exemplary case where any other element resides on either of the upper and lower sides of the meltdown portion of the fuse, it is also allowable to adopt a structure in which only the upper and lower sides are covered with the upper plate 114 and lower plate 103, while leaving the lateral sides uncovered. In the case that any other element disposed on only either side of the upper and lower sides, as far as prevention of the scattered conductor during the fuse meltdown is considered, it is all enough to dispose the plate only between the element in concern and the fuse. Even in such a case, it is, however, still preferable to dispose the plates both on the upper and lower sides, in view of confining the heat generated during the fuse meltdown in the vicinity of the fuse meltdown portion 107.

Figure 2:
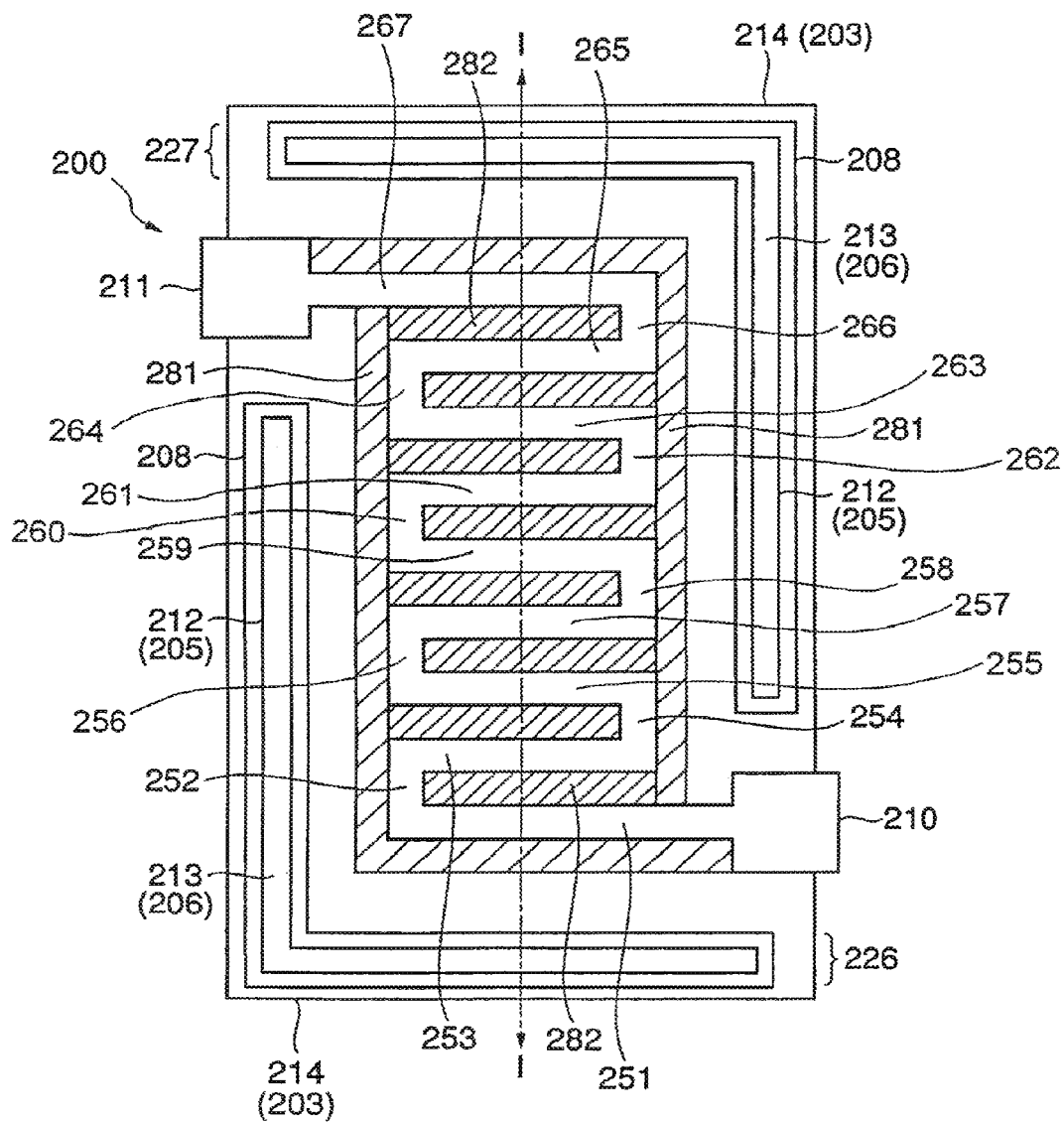
FIG. 2 is a plan view showing a form of a fuse according to a modified example of the first embodiment.
Figure 3:
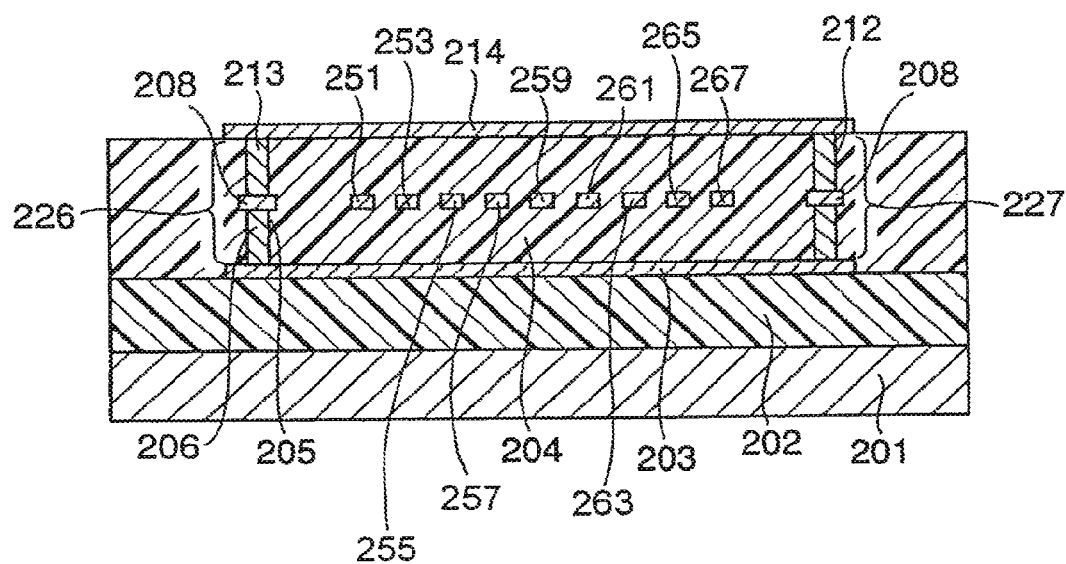
FIG. 3 is a sectional view taken along line I-I in FIG. 2.

Next, a modified embodiment of the first embodiment will be explained referring to FIGS. 2 and 3. FIG. 2 is a plan view of the fuse, and FIG. 3 is a sectional view taken along line I-I in FIG. 2. The modified embodiment adopts a configuration in which the meltdown portion of the fuse is configured as extending unidirectionally and being folded at least once, a plurality of times for example, rather than as being formed in a straight-line form, and more specifically, configured as having a forward straight portion extending in a single direction, a backward straight portion extending back in a direction opposite to the single direction, and a normal straight portion normal to the single direction, which connects the forward straight portion and the backward straight portion.

As shown in FIGS. 2 and 3, a fuse 200 is provided in a second interlayer dielectric film 204 on a first interlayer dielectric film 202 on a semiconductor substrate 201. It is to be noted that the second interlayer dielectric film 204 is practically composed of a plurality of interlayer dielectric films although it is illustrated herein as a single layer for the simplicity of explanation. The fuse 200 is covered with a lower plate 203 and an upper plate 214 on the lower and upper sides thereof, and with via plugs 206, 213 filled in via holes 205, 212 on the side portions, respectively, thereof. The upper and lower via plugs 213, 206 are interconnected through pad electrodes 208 formed at the same time with the fuse 200, and the via plugs 206, 213 thus configure, together with the pad electrodes 208, side plates 226 and 227 on both lateral sides, respectively, of the fuse 200.

The fuse 200 is melted down by supplying a predetermined energy of current from a current entrance terminal 210 towards a current exit terminal 211. The fuse 200 has, on the current entrance terminal 210 side thereof, a first forward straight portion 251; a first backward straight portion 253; a first normal connection portion 252 which connects the first forward straight portion 251 and the first backward straight portion 253; a second forward straight portion 255 extending back in a direction opposite to the direction of the first backward straight portion 253; a second normal connection portion 254 which connects the first backward straight portion 253 and the second forward straight portion 255; a second backward straight portion 257 extending back in a direction opposite to the direction of the second forward straight portion 255; a third normal connection portion 256 which connects the second forward straight portion 255 and the second backward straight portion 257; a third forward straight portion 259 extending back in a direction opposite to the direction of the second backward straight portion 257; a forth normal connection portion 258 which connects the second backward straight portion 257 and the third forward straight portion 259; a third backward straight portion 261 extending back in a direction opposite to the direction of the third forward straight portion 259; a fifth normal connection portion 260 which connects the third forward straight portion 259 and the third backward straight portion 261; a forth forward straight portion 263 extending back in a direction opposite to the direction of the third backward straight portion 261; a sixth normal connection portion 262 which connects the third backward straight portion 261 and the forth forward straight portion 263; a forth backward straight portion 265 extending back in a direction opposite to the direction of the forth forward straight portion 263; a seventh normal connection portion 264 which connects the forth forward straight portion 263 and the forth backward straight portion 265; a fifth forward straight portion 267 extending back in a direction opposite to the direction of the forth backward straight portion 265; a eighth normal connection portion 266 which connects the forth backward straight portion 265 and the fifth forward straight portion 267, and further the current exit terminal 211 which contacts the fifth forward straight portion 267.

Theoretically, a third forward straight portion 259, which resides in the midst of nine straight portions, that is first to fifth forward straight portions and first to forth backward straight portions, is supposed to be most likely to melt.

Since thus-configured fuse 200 is enveloped by the lower plate 203, upper plate 214 and side plates 226, 227, which are the conductors vertically and laterally cover the fuse, heat generated at the fuse under current supply thereto is reflected and confined within a space surrounded by these plates, so that the fuse can readily be melted down. In thus-configured fuse 200, when a predetermined energy of current is supplied from the current entrance terminal 210 towards the current exit terminal 211, summation of heat generated in hatched portions 281 (which is heat generating region outside the fuse 200) outside the fuse 200 and heat generated in hatched portions 282 (which is heat generating region inside the fuse 200) inside the fuse 200 is further caused, and this successfully promotes the meltdown of the third forward straight portion 259 which resides in the center portion as being sandwiched by the hatched portions 281. Therefore the fuse 200 can more readily be melted down.

A conductive material available herein for composing the fuses 100, 200 may be any of a material mainly composed of copper (Cu), doped polysilicon, silicon-germanium alloy and silicide.

Embodiment Example 2

Figure 4A:
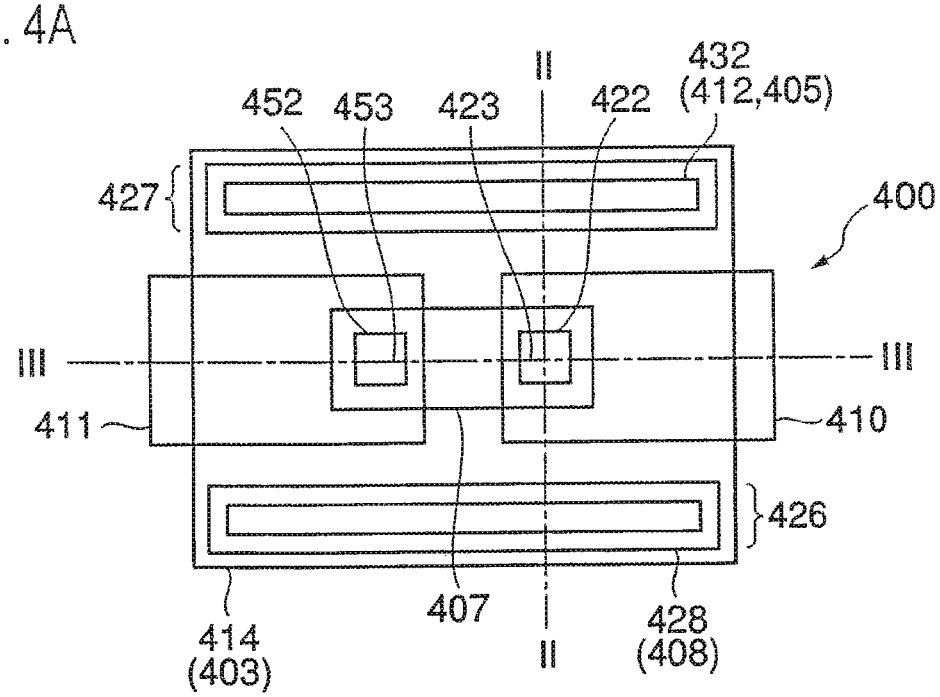
FIG. 4A is a plan view showing a form of a fuse according to a second embodiment of the present invention.

The foregoing embodiment described a case where the fuse was disposed in parallel to the surface of the semiconductor substrate. Then, a second embodiment will describe a case where the fuse is disposed normal to the surface of the semiconductor substrate referring to FIG. 4A, FIG. 4B and FIG. 5. FIG. 4A is a plan view of the fuse, FIG. 4B is a sectional view taken along line II-II in FIG. 4A, and FIG. 5 is a sectional view taken along line III-III in FIG. 4A.

Figure 4B:
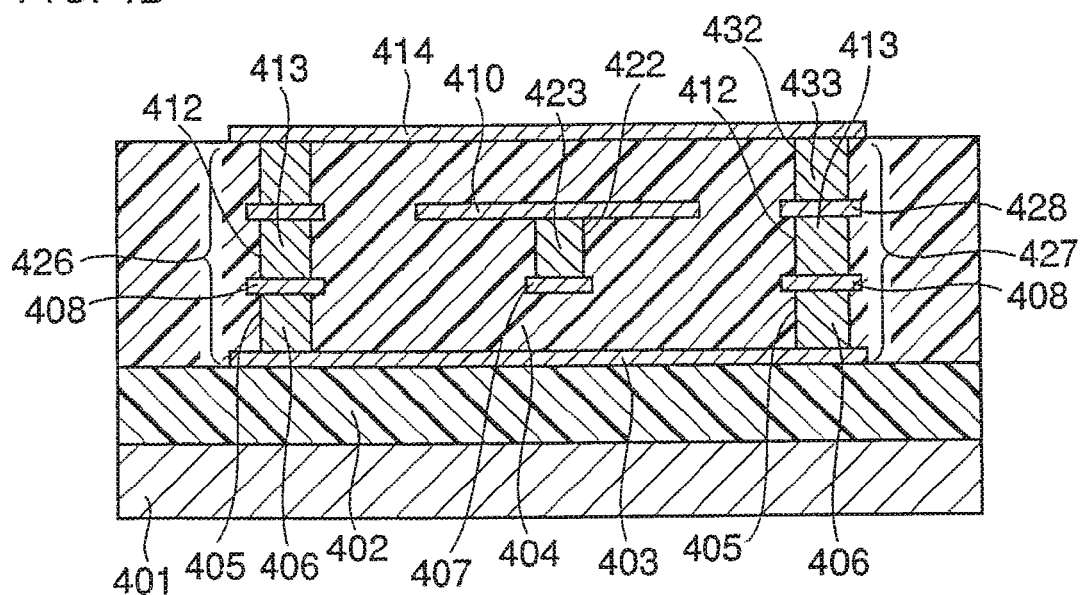
FIG. 4B is a sectional view taken along line II-II in FIG. 4A.
Figure 5:
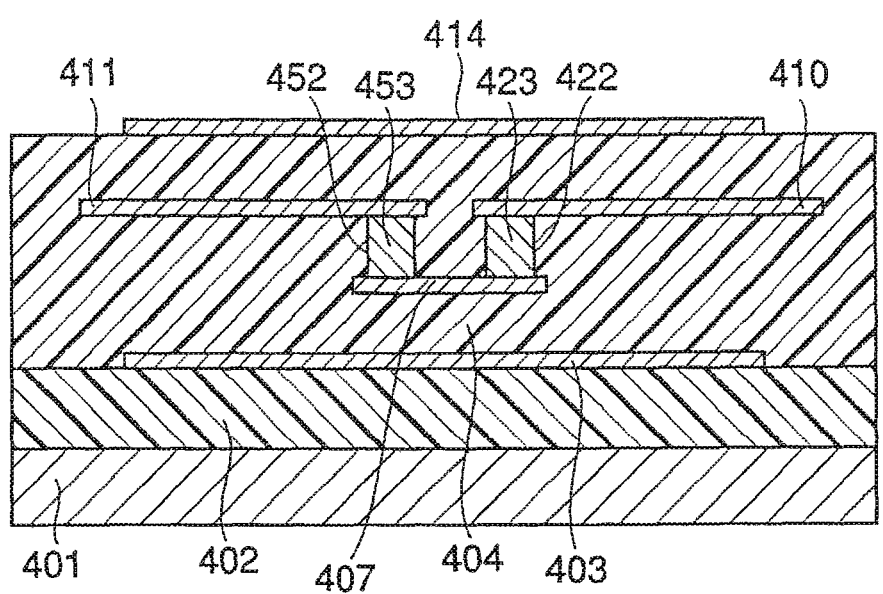
FIG. 5 is a sectional view taken along line III-III in FIG. 4A.

As shown in FIGS. 4A and 4B, a fuse 400 is disposed in a second interlayer dielectric film 404 on a first interlayer dielectric film 402 on a semiconductor substrate 401. It is to be noted that the second interlayer dielectric film 404 is practically composed of a plurality of interlayer dielectric films although it is illustrated herein as a single layer for the simplicity of explanation. The fuse 400 is covered with a lower plate 403 and an upper plate 414 on the lower and upper sides, respectively, thereof, and with via plugs 406, 413, 433 filled in via holes 405, 412, 432, respectively, on the side portions thereof. The middle and lower via plugs 413, 406 are interconnected through pad electrodes 408. The middle and upper via plugs 413, 433 are interconnected through pad electrodes 428. The fuse 400 has a current entrance terminal 410 and a current exit terminal 411, and current supplied to the current entrance terminal 410 flows through a via-plug meltdown portion 423 filled in a via hole 422 to reach the pad electrode 407, and further flows through a via-plug meltdown portion 453 filled in a via hole 452 to reach the current exit terminal 411. Current supply to the current entrance terminal 410 supposed to result in meltdown of either of the via-plug meltdown portions 423, 453, but it is also allowable that the pad electrode 407 interconnecting the via-plug meltdown portions 423, 453 is melted off. The pad electrode 407 is therefore formed so as to have a width as marrow as possible as shown in FIG. 4A (of course narrower than the width of the current entrance terminal 410 and current exit terminal 411), but slightly wider than the width of the via-plug meltdown portions 423, 453. It is further necessary, as shown in FIG. 5, to arrange the via-plug meltdown portions 423, 453 as close to each other as possible so as to allow heat concentration. It is still further necessary, as shown in FIG. 4B, to configure the side plates 426, 427 both of which are composed of the via plugs 406, 413, 433 and the pad electrodes 408, 428 on both sides of the fuse 400, in order to prevent the heat generated at the via-plug meltdown portions 423, 453 from dissipating outwardly.

When a predetermined energy of current is supplied from the current entrance terminal 410 towards the current exit terminal 411, heat is generated at the via meltdown portions 423, 453 of the fuse 400, and optionally at the pad electrode 407 which may be a meltdown portion, and is concentrated thereto after being intercepted and reflected by the plates 414, 403, 426, 427 on the vertical and lateral sides, so as to cause easy meltdown. At the same time, the conductor to be scattered around can be blocked by the lower plate 403, upper plate 414 and side plates 426, 427, and is prevented from reaching the other elements arranged outside these plates.

Although this embodiment adopted a structure in which the meltdown portion of the fuse is almost completely enveloped by disposing the conductor plates on the vertical and lateral sides of the fuse, the present invention is by no means limited thereto. More specifically, in an exemplary case where any other element resides on either of the left-hand and right-hand sides of the meltdown portion of the fuse, it is also allowable to adopt a structure in which only the left-hand and right-hand sides are covered with the side plates 426, 427, while leaving the upper and lower sides uncovered. In the case that any other element disposed on only either side of the left-hand and right-hand sides, as far as prevention of the scattered conductor during the fuse meltdown is considered, it is all enough to provide the plate only between the element in concern and the fuse. Even in such a case, it is, however, still preferable to dispose the plates both on the left-hand and right-hand sides, and further on the upper and lower sides, in view of confining the heat generated during the fuse meltdown in the vicinity of the fuse meltdown portion 407 and via-plug meltdown portions 423, 453.

Also the fuse 400 may be composed of materials similar to those listed in the aforementioned first embodiment.

As has been described in the above, the first and second embodiment of the present invention, in which the meltdown portion of the fuse is surrounded by the plates, is successful in confining the heat generated during the meltdown in the vicinity of the meltdown portion, and in reducing the voltage or current for the fuse meltdown to a considerable degree as compared with that required for the conventional semiconductor device.

The invention claimed is:
1. A semiconductor device, comprising:
a substrate;
an insulating layer formed over the substrate;

a first conductive plate formed in the insulating layer and formed at a first wiring layer;
a fuse element formed in the insulating layer and formed at a second wiring layer, the second wiring layer being one level above the first wiring layer;
a second conductive plate formed over the insulating layer and formed at a third wiring layer which is one level upper than the second wiring layer;
a third conductive plate formed in the insulating layer and formed at the second wiring layer; and
a fourth conductive plate formed in the insulating layer and formed at the second wiring layer,
wherein the fuse element includes copper,
wherein the fuse element is brought into a blow state by a current supplied thereto,
wherein the fuse element has a first portion including a meltdown portion,
wherein the first conductive plate is formed below the fuse element in a planar view,
wherein the second conductive plate is formed above the fuse element in the planar view,
wherein the first portion, the third conductive plate, and the fourth conductive plate extend in a first direction of the planar view, and
wherein the first portion is located between the third conductive plate and the fourth conductive plate in a second direction of the planar view perpendicular to the first direction.

2. A semiconductor device according to claim 1,
wherein the fuse element has a second portion located at an end of the first portion in the first direction, and
wherein a width of the first portion in the second direction is smaller than a width of the second portion in the second direction.

3. A semiconductor device according to claim 2,
wherein a part of the third conductive plate is located in the second direction when seen from the second portion.

4. A semiconductor device according to claim 3, wherein,
the third conductive plate extends in the first direction spaced apart from the first portion at a first distance, and
the third conductive plate extends in the first direction spaced apart from the second portion at a second distance, the first distance being greater than the second distance.

5. A semiconductor device according to claim 1,
wherein, in the second wiring layer, there are no wiring between the fuse element and the third conductive plate, and there are no wiring between the fuse element and the fourth conductive plate.

6. A semiconductor device according to claim 1,
wherein, in planar view, there are no wiring between the fuse element and the first conductive plate, and there are no wiring between the fuse element and the second conductive plate.

7. A semiconductor device according to claim 1,
wherein the first conductive plate, the second conductive plate, the third conductive plate, and the fourth conductive plate each include copper.

8. A semiconductor device according to claim 1,
wherein the fuse element has a second portion located at an end of the first portion in the first direction with a first end edge of the second portion, running in the second direction, joining to a terminal end of the first portion,
wherein a width of the first portion in the second direction is smaller than a width of the second portion in the second direction, and
wherein the third conductive plate extends in the first direction adjacent the first portion and the second portion beyond the first edge of the second portion.

9. A semiconductor device according to claim 8, wherein,
the second portion has a second end edge extending in the second direction, and
the third conductive plate extends in the first direction adjacent the second portion and terminates, at a distal end edge, before the second end edge of the second portion.

10. A semiconductor device according to claim 9, wherein,
the third conductive plate extends in the first direction spaced apart from the first portion, in the second direction, at a first distance, and
the third conductive plate extends in the first direction spaced apart from the second portion, in the second direction, at a second distance, the first distance being greater than the second distance.

11. A semiconductor device according to claim 1,
wherein the fuse element has a second portion located at an end of the first portion in the first direction with a first end edge of the second portion, extending in the second direction, joining to a terminal end of the first portion,
wherein a width of the first portion in the second direction is smaller than a width of the second portion in the second direction,
wherein the third conductive plate extends in the first direction adjacent to the first portion and the second portion at least to the first end edge of the second portion, and
wherein the third conductive plate is spaced apart, in the second direction, from the first and second portions.

12. A semiconductor device according to claim 11, wherein,
the third conductive plate extends in the first direction spaced apart from the first portion at a first distance, and
the third conductive plate extends in the first direction spaced apart from the second portion at a second distance, the first distance being greater than the second distance.

* * * * *